United States Patent
He et al.

(10) Patent No.: US 7,945,842 B2
(45) Date of Patent: May 17, 2011

(54) METHOD AND APPARATUS FOR RATELESS SOURCE CODING WITH/WITHOUT DECODER SIDE INFORMATION

(75) Inventors: Dake He, Yorktown Heights, NY (US); Ashish Jagmohan, Irvington, NY (US); Jing Jiang, College Station, TX (US)

(73) Assignee: International Business Machines Corporation, Armonk, NY (US)

( * ) Notice: Subject to any disclaimer, the term of this patent is extended or adjusted under 35 U.S.C. 154(b) by 1001 days.

(21) Appl. No.: 11/764,876

(22) Filed: Jun. 19, 2007

(65) Prior Publication Data
US 2008/0320363 A1    Dec. 25, 2008

(51) Int. Cl.
*H03M 13/00* (2006.01)
(52) U.S. Cl. .......................... 714/779; 714/758
(58) Field of Classification Search ................... 714/758, 714/779
See application file for complete search history.

(56) References Cited

U.S. PATENT DOCUMENTS

| | | | |
|---|---|---|---|
| 6,633,856 B2* | 10/2003 | Richardson et al. | 706/15 |
| 6,789,227 B2* | 9/2004 | De Souza et al. | 714/804 |
| 6,895,547 B2* | 5/2005 | Eleftheriou et al. | 714/801 |
| 7,434,146 B1* | 10/2008 | Verdu et al. | 714/780 |
| 2003/0014718 A1* | 1/2003 | De Souza et al. | 714/804 |
| 2003/0074626 A1 | 4/2003 | Coker et al. | |
| 2004/0034828 A1* | 2/2004 | Hocevar | 714/800 |
| 2007/0113148 A1 | 5/2007 | Hong et al. | |
| 2007/0217432 A1* | 9/2007 | Molisch et al. | 370/400 |

OTHER PUBLICATIONS

"Low-density parity-check code", From Wikipedia, the free Encyclopedia; pp. 1-5.
"Universal Variable Length Data Compression of Binary Sources Using Fountain Codes", in Proc. ITW 2004, G. Caire, S. Shamai, A. Shokrollahi and S. Verdu.
"Distributed Source Coding Using Serially-Concatenated-Accumulate Codes", in Proc. ITW 2004, J. Chen, A. Khisti, D. M. Malioutov and J. S. Yedidia.
"Rate-Adaptive Distributed Source Coding Using Low-Density Parity-Check Codes", in Proc. Asilomar, Pacific Grove, CA, 2005, Varodayan, A. Aaron and B. Girod.
"Rateless Slepian-Wolf Codes", in Proc. Asilomar, Pacific Grove, CA, 2005, A. Eckford and W. Yu.
"Factor Graphs and the Sum-Product Algorithm", IEEE Transactions on Information Theory, vol. 47, No. 2, Feb. 2001; F. R. Kschischang, B. J. Frey and H. Loeliger.

* cited by examiner

*Primary Examiner* — M. Mujtaba K Chaudry
(74) *Attorney, Agent, or Firm* — Scully, Scott, Murphy & Presser, P.C.; Stephen C. Kaufman, Esq.

(57) ABSTRACT

A method of and system for rateless source coding are disclosed. The method comprises the steps of providing a set of low-density parity check (LDPC) codes, each of which accepts a range of data input lengths and a range of target compression rates; identifying a data input having a data input length; and identifying a desired compression rate. The method comprises the further steps of selecting one of said LDPC codes based on said data input length and desired compression rate; encoding the data input, using the selected LDPC code, to generate a sequence of data values; and puncturing some of said encoded data values to achieve the desired compression rate. Preferably, the encoding step includes the steps of generating a syndrome and a parity sequence from the data input, puncturing the generated parity sequence, and mixing a remaining portion of the data input with the punctuated parity sequence.

20 Claims, 6 Drawing Sheets

METHOD AND APPARATUS FOR RATELESS SOURCE CODING WITH/WITHOUT DECODER SIDE INFORMATION

BACKGROUND OF THE INVENTION

1. Field of the Invention

This invention generally relates to data compression, and more specifically, to methods and apparatus for losslessly compressing data. Even more specifically, the preferred embodiment of the invention relates to rateless source coding with/without decoder side information by using a small number of codes, each of which can be adapted to accommodate in a wide range of compression rates and input data lengths.

2. Background Art

The state-of-the-art approach to lossless data compression with decoder only side information (also called Slepian-Wolf coding) is to use low-density parity-check (LDPC) codes. To see how a LDPC code can be applied to compress a sequence $X_1 X_2 \ldots X_N$, let us look at an example. Without losing generality, suppose that the sequence $X_1 X_2 \ldots X_N$ is a binary sequence. On the encoder side, since a LDPC code can be conveniently represented by a bi-partite graph, we can regard $X_1 X_2 \ldots X_N$ as the input to the variable nodes (circle-shaped) of the bi-partite graph in FIG. 1. The output $S_1 S_2 \ldots S_m$ of the LDPC code is taken from the check nodes (square-shaped) of the bipartite graph in FIG. 1 in response to the input $X_1 X_2 \ldots X_N$, where each $S_j$ is a linear combination of the subset of $X_1 X_2 \ldots X_N$. For example, if $S_1$ is connected to $X_1$, $X_3$, and $X_5$. Then $S_1 = X_1 \oplus X_2 \oplus X_5$, where $\oplus$ denotes addition in the binary field GF(2). In the literature, the sequence $S_1 S_2 \ldots S_m$ is referred to as the syndrome of $X_1 X_2 \ldots X_N$. Since $S_1 S_2 \ldots S_m$ is typically a much shorter binary sequence than $X_1 X_2 \ldots X_N$, compression is achieved, and the compression rate is equal to m/N.

On the decoder side, the decoder uses the same bi-partite graph to decode $X_1 X_2 \ldots X_N$ from the side information $Y_1 Y_2 \ldots Y_N$ and the received sequence $S_1 S_2 \ldots S_m$. Note that in the case where the side information $Y_1 Y_2 \ldots Y_N$ is not available, we can regard $Y_1 Y_2 \ldots Y_N$ as erasures at the decoder input. This convention is used throughout this document. There are many algorithms that can be used in the decoding process. One of the practically important low complexity decoding algorithm is belief propagation (BP) based iterative "message passing" decoding algorithm. BP decoding was first discussed by Robert Gallager in his dissertation "low density parity check codes" in 1963. A collection of papers on LDPC codes and BP decoding algorithms can be found in the "Special Issue on Codes on Graphs and Iterative Algorithms," IEEE Transactions on Information Theory, 47(2), February 2001. In the source coding with decoder side information setup, a typical decoder using BP decoding works as follows. From $Y_1 Y_2 \ldots Y_N$ and the statistical correlation between $Y_1 Y_2 \ldots Y_N$ and $X_1 X_2 \ldots X_N$, the decoder gets the initial soft information about $X_1 X_2 \ldots X_N$, that is, the likelihood that each $X_i$ is equal to 0 or 1 in the binary case. This initial soft information is injected into the variable nodes of the bi-partite graph, and propagates along the edges in the bi-partite graph to the check nodes. At the check nodes, this information is updated according to the constraints set by the received syndrome values $S_1 S_2 \ldots S_m$, and sent back to the variable nodes. Combining the information from the checknodes and the initial soft information, the variable nodes get a new iteration of the soft information about $X_1 X_2 \ldots X_N$. From this new information, the decoder can form an estimate of $X_1 X_2 \ldots X_N$. The above process of exchanging information between variable nodes and check nodes continues until either one of the following conditions is satisfied: 1) the number of iterations exceeds a pre-set threshold; or 2) the decoder has obtained an estimated sequence whose output in the bi-partite graph is equal to $S_1 S_2 \ldots S_m$. If Case 2) happens and the estimated sequence is equal to $X_1 X_2 \ldots X_N$, the decoding is successful. If the event that the decoding is successful happens with probability close to 1, the compression efficiency of the LDPC code is determined by the gap between the rate m/N and the theoretical limit $H(X_1 X_2 \ldots X_N | Y_1 Y_2 \ldots Y_N)/N$.

It may be observed that in the above approach, once the LDPC code, or equivalently the bi-partite graph, is fixed, the compression rate is fixed (in the above example, m/N). Therefore, if the side information changes, quite often the LDPC code has to be changed in order to maintain compression efficiency. This implies that for each distinct design rate, one has to design a distinct LDPC code, and thus incurs significant storage complexity.

When the quality of the decoder side information (evaluated by the quantity $H(X_1 X_2 \ldots X_N | Y_1 Y_2 \ldots Y_N)$) is unknown, it is clearly desirable to have a code that can be easily adapted to a wide range of design rates, while at the same time maintains compression efficiency. Such a code is called a rateless code for brevity, and the property of being able to adapt to a range of design rates is called rate adaptivity. In order to achieve rate adaptivity, prior art procedures often choose to modify the code (or equivalently the bi-partite graph) in a fixed way and thus sacrifice compression efficiency. Specifically, in *Universal variable length data compression of binary sources using fountain codes*, in Proc. ITW 2004, G. Caire, S. Shamai, A. Shokrollahi, and S. Verdu, used the so-called fountain codes with iterative doping at the encoder side to achieve rate adaptivity. However, the fountain codes are designed specifically for binary erasure channels (BEC), and might perform poorly in data compression where the channel involved is often not a BEC. Another drawback of the Fountain code approach is that the encoder uses a computationally complex procedure called iterative doping.

FIG. 2 shows a naïve approach to rate adaptivity, in which a sequence $X_1 X_2 \ldots X_N$ is input to an LDPC code, which then outputs syndrome $S_1 \ldots S_m$. In the naive approach, rate adaptivity is achieved by punctuating the syndrome sequence $S_1 \ldots S_m$. For example, if one would like to achieve rate $m_1/N$, where $m_1$ is less than m, the encoder simply selects $m_1$ symbols from $S_1 \ldots S_m$ as the output, and discards the rest of the sequence ('punctured'). It is easy to see that as $m_1$ gets farther away from m, more and more syndrome symbols in $S_1 \ldots S_m$ are punctured, or equivalently, more and more check nodes in the bi-partite graph of the LDPC code become unused. Consequently, the performance of the naive approach degrades rapidly as the distance between m and $m_1$ increases.

In *Distributed source coding using serially-concatenated-accumulate codes*, in Proc. ITW 2004, J. Chen, A. Khisti, D. M. Malioutov, and J. S. Yedidia proposed a rate adaptive scheme based on syndrome splitting using product accumulate code (PA) and accumulate extended Hamming (e-Hamming) code. The set of codes based on this scheme are semi-regular and the degree profiles are difficult to be optimized by standard techniques. FIG. 3 illustrates a procedure for achieving rate adaptivity by syndrome splitting. A similar work was considered by D. Varodayan, A. Aaron, and B. Girod in *Rate-adaptive distributed source coding using low-density parity-check codes*, in Proc. Asilomar, Pacific Grove, Calif., 2005, where rate adaptivity is achieved by sending part of the accumulated syndromes. However, the performance of these codes is still far away from the theoretical compression limit.

Another approach to designing rateless codes was recently proposed by A. Eckford and W. Yu, in *Rateless Slepian-Wolf codes*, in Proc. Asilomar, Pacific Grove, Calif., 2005. In this approach, a dual-purpose large bi-partite graph along with an additional small bi-partite graph was designed as a single rateless code. The main drawback of this approach is that it becomes daunting to design more than two coding rates.

SUMMARY OF THE INVENTION

An object of this invention is to provide an improved data compression method and apparatus.

Another object of the present invention is to provide an improved method and apparatus for rateless source coding.

A further object of the invention is to achieve rateless source coding with/without decoder side information by using a small number of rateless codes, each of which can accommodate a wide range of design rates without changing its corresponding bi-partite graph and at the same time maintain good compression efficiency for any design rate in that range.

These and other objectives are attained with a method of and system for rateless source coding. The method comprises the steps of providing a set of low-density parity check (LDPC) codes, each of said codes accepting a range of data input lengths and a range of target compression rates; identifying a data input having a data input length; and identifying a desired compression rate. The method comprises the further steps of selecting one of said LDPC codes based on said data input length and desired compression rate; encoding the data input, using the selected LDPC code, to generate an encoded sequence of data values; and puncturing some of said encoded data values to maintain the compression efficiency of the selected LDPC code.

In the preferred embodiment, the encoding step includes the steps of generating a syndrome sequence and a parity sequence from the data input, and mixing a remaining portion of the data input with the generated parity sequence according to a predefined arithmetic operation. In addition, in the preferred embodiment, the parity sequence includes a multitude of parity bits, and the puncturing step includes the step of puncturing the parity bits according to the desired compression rate.

An important aspect of the present invention is to use a single code to accommodate a wide range of design rates and a wide range of data input lengths. In contrast to previous procedures, the rate-adaptivity is achieved in this invention by puncturing at the variable nodes. The code's compression efficiency is thus maintained because its bi-partite graph is kept intact.

A preferred system embodying the present invention comprises a small set of LDPC codes, a code selector, a syndrome/parity generator, and a mixing unit. Each of the LDPC codes accepts a range of data input lengths and a range of target compression rates, and the code selector selects one of said LDPC codes according to the data input length and the desired compression rate. The syndrome/parity generator generates a syndrome sequence and a parity sequence by using an LDPC code in response to the data input.

The mixing unit mixes the remaining portion of the data sequence, if any, with the generated parity sequence according to a predefined arithmetic operation. A puncturing unit is provided to puncture the parity bits according to the desired compression rates, and a multiplexor is provided to form an output bitstream from the generated syndrome sequence and the punctured parity bit sequence confirming to a predefined syntax.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

The present invention generally provides a method and system for rateless source coding. Generally, the method comprises the steps of providing a set of low-density parity check (LDPC) codes, each of said codes accepting a range of data input lengths and a range of target compression rates; identifying a data input having a data input length; and identifying a desired compression rate. The method comprises the further steps of selecting one of said LDPC codes based on said data input length and desired compression rate; encoding the data input, using the selected LDPC code, to generate an encoded sequence of data values; and puncturing some of said data values to maintain the compression efficiency of the selected LDPC code. An important feature of the preferred method is that during the encoding process, the bi-partite graphs of said LDPC codes are kept intact.

In the preferred embodiment, the encoding step includes the steps of generating a syndrome sequence and a parity sequence from the data input by using a selected LDPC code, and mixing a remaining portion of the data input with the generated parity sequence according to a predefined arithmetic operation. In addition, in the preferred embodiment, the parity sequence includes a multitude of parity bits, and the puncturing step includes the step of puncturing the parity bits according to the desired compression rate. Note that since only parity bits are punctured, it can be seen in the preferred embodiment the bi-partite graph of the selected LDPC code is kept intact. On the decoder side of the preferred embodiment, the parity bits that are punctured are modeled as erasures in the decoding process.

Figure 1:
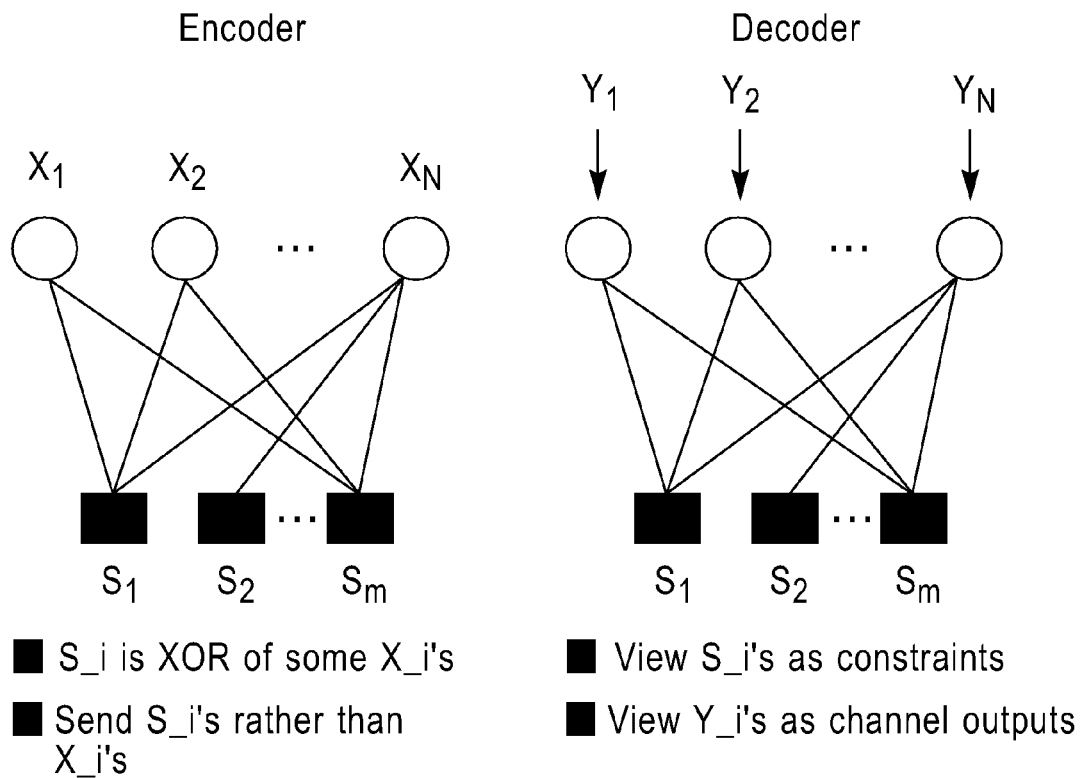
FIG. 1 illustrates an LDPC code for compression with decoder only side information.
Figure 2:
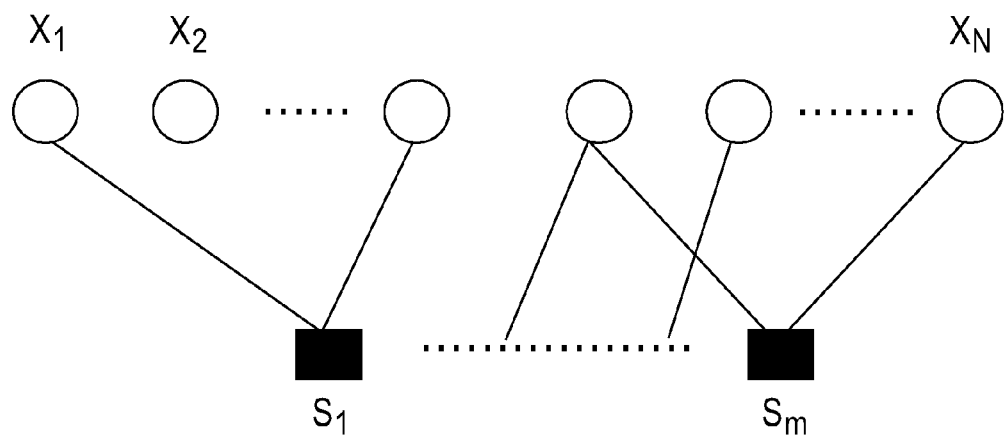
FIG. 2 shows a simple approach to rate adaptivity.
Figure 3:
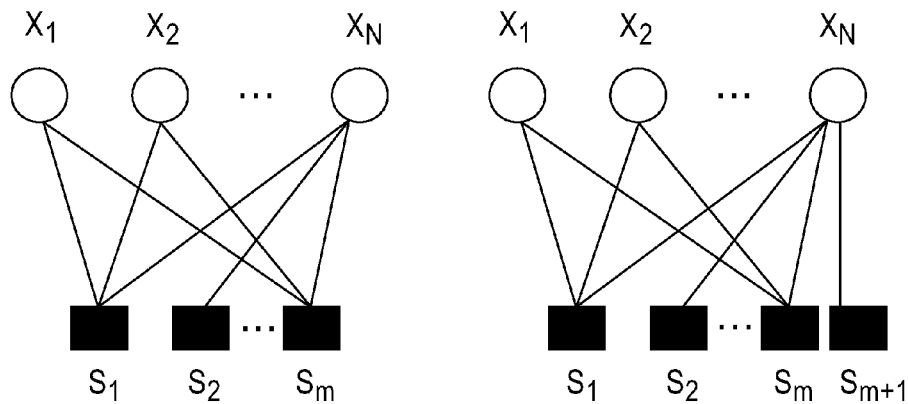
FIG. 3 illustrates achieving rate adaptivity by syndrome splitting.
Figure 4:
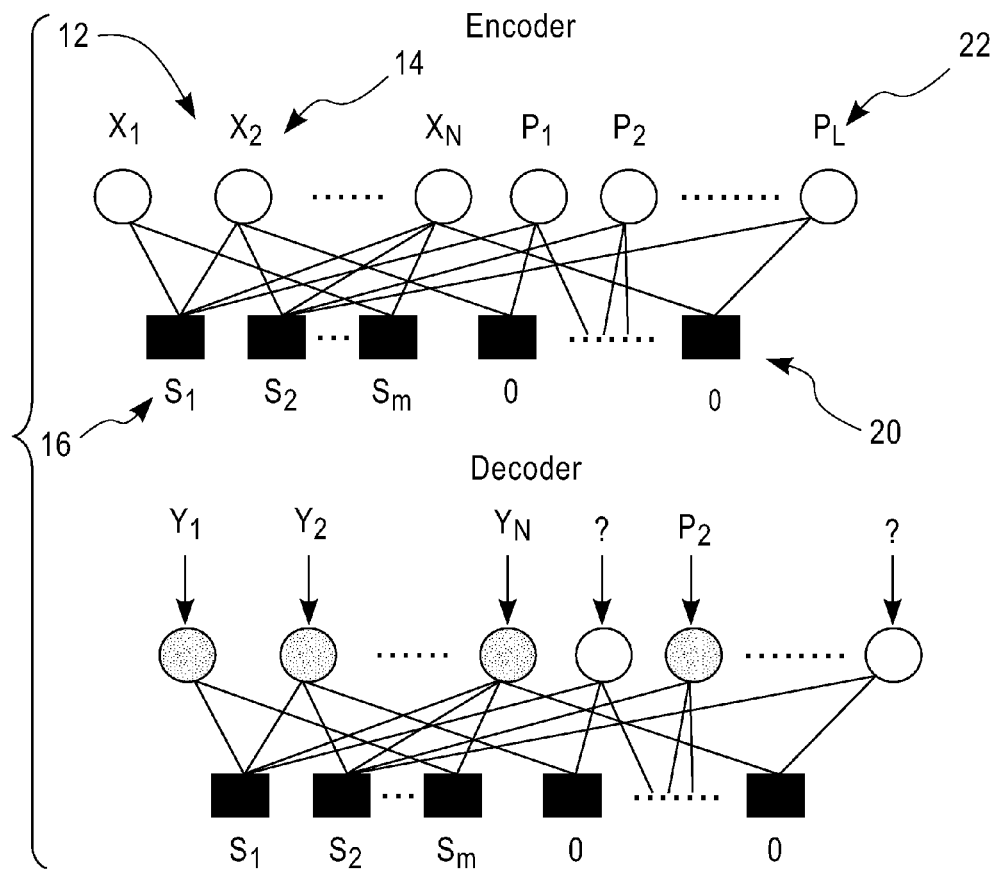
FIG. 4 illustrates an exemplary rateless LDPC code according to the present invention.

FIG. 4 shows an example illustrating how rateless coding is preferably achieved in this invention. The data sequence $X_1 X_2 \ldots X_N$, represented at 12, is input to a subset of variable nodes 14 of the exemplary LDPC code. By forcing a subset 20 of syndromes to be zero (known both to the encoder and to the decoder), the values of the rest of the variable nodes of the LDPC codes can then be determined. The resulting sequence $p_1 p_2 \ldots p_L$, represented at 22, is called the parity sequence. A sequence of syndromes 16 is then generated using $X_1 X_2 \ldots X_N$ and $p_1 p_2 \ldots p_L$. To achieve rate adaptivity, the sequence $p_1 p_2 \ldots p_L$ is punctured according to the desired compression rate. Consequently, the sequence $X_1X_2 \ldots X_N$ is compressed into two streams: a subsequence of its syndromes $S_1S_2 \ldots S_m$, and the punctured $p_1p_2 \ldots p_L$. On the decoder side, the decoder has the same LDPC code, all the syndromes (received $S_1S_2 \ldots S_m$ and the remaining zeros), the side information $Y_1Y_2 \ldots Y_N$, and the punctured $p_1p_2 \ldots p_L$. Regarding the punctured variable nodes as erasures, the decoder can then recover $X_1X_2 \ldots X_N$ and $p_1p_2 \ldots p_L$ as if they are the data input resulting in the syndrome sequence $S_1S_2 \ldots S_m00 \ldots 0$ and the associated side information is $Y_1Y_2 \ldots Y_N$ combined with the punctured $p_1p_2 \ldots p_L$ received by the decoder. Note that throughout the encoding process, the bi-partite graph of the exemplary code is kept intact.

Figure 5:
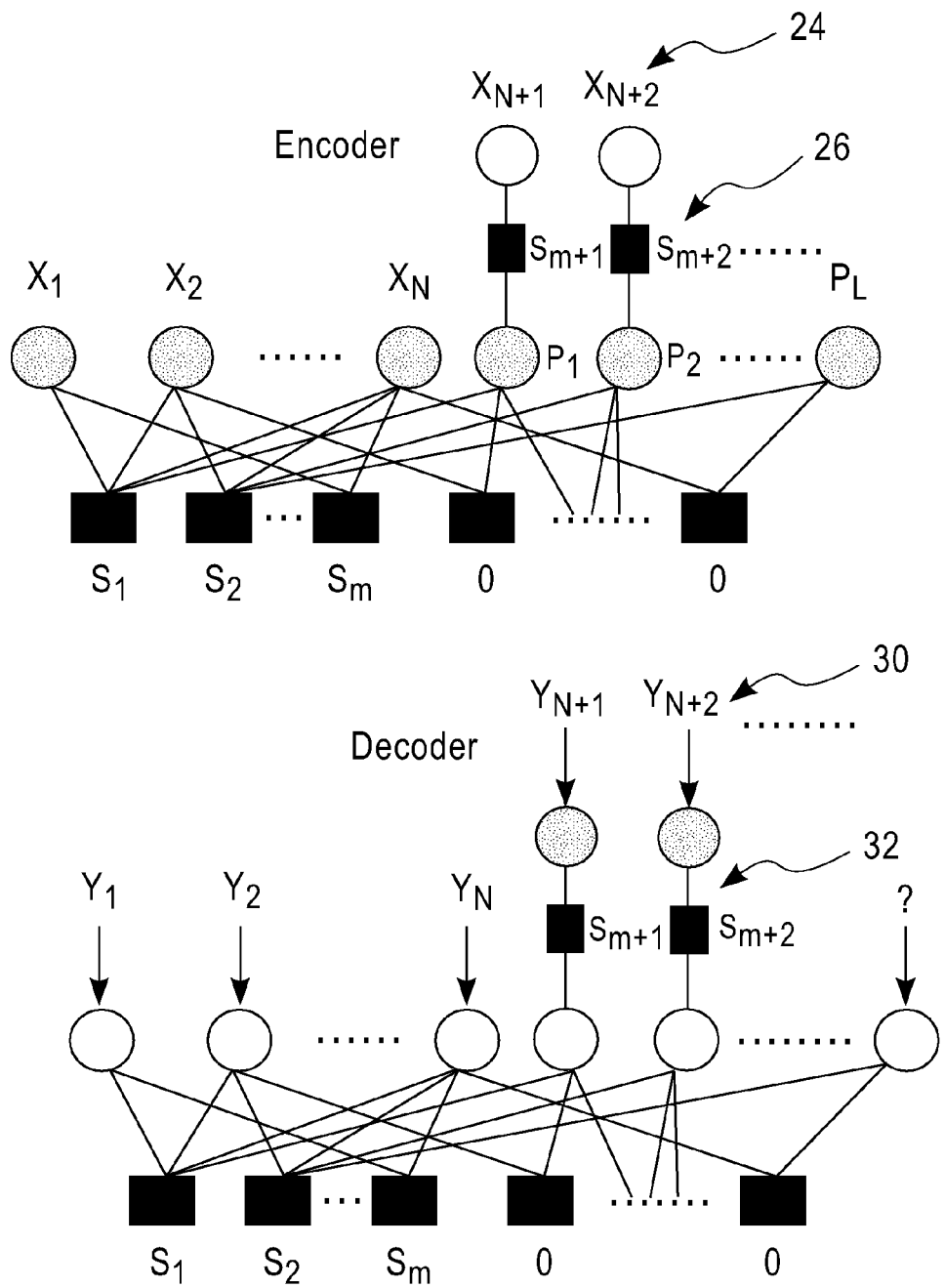
FIG. 5 illustrates how the LDPC code in FIG. 4 can be adapted to accept variable length input.

FIG. 5 further shows an example illustrating how to use a rateless code to accommodate variable length input in this invention. In order to handle variable length input with the same code in FIG. 4, we first use $X_1X_2 \ldots X_N$ to obtain $p_1p_2 \ldots p_L$ and then $S_1S_2 \ldots S_m$. The only difference is that the additional $X_{N+1}X_{N+2}$ (which is determined by the source length), represented at 24, is added to $p_1p_2$ to get $S_{m+1}S_{m+2}$, represented at 26, which is transmitted together with $S_1S_2 \ldots S_m$, and the remaining $p_3p_4 \ldots p_L$ is punctured to achieve the desired compression rate. On the decoder side, the difference lies in that the side information for the variable nodes $p_1$ and $p_2$ is calculated from $Y_{N+1}Y_{N+2}$, represented at 30, and $S_{m+1}S_{m+2}$, represented at 32. Note again that throughout the encoding process, the bi-partite graph of the exemplary code is kept intact.

Figure 6:
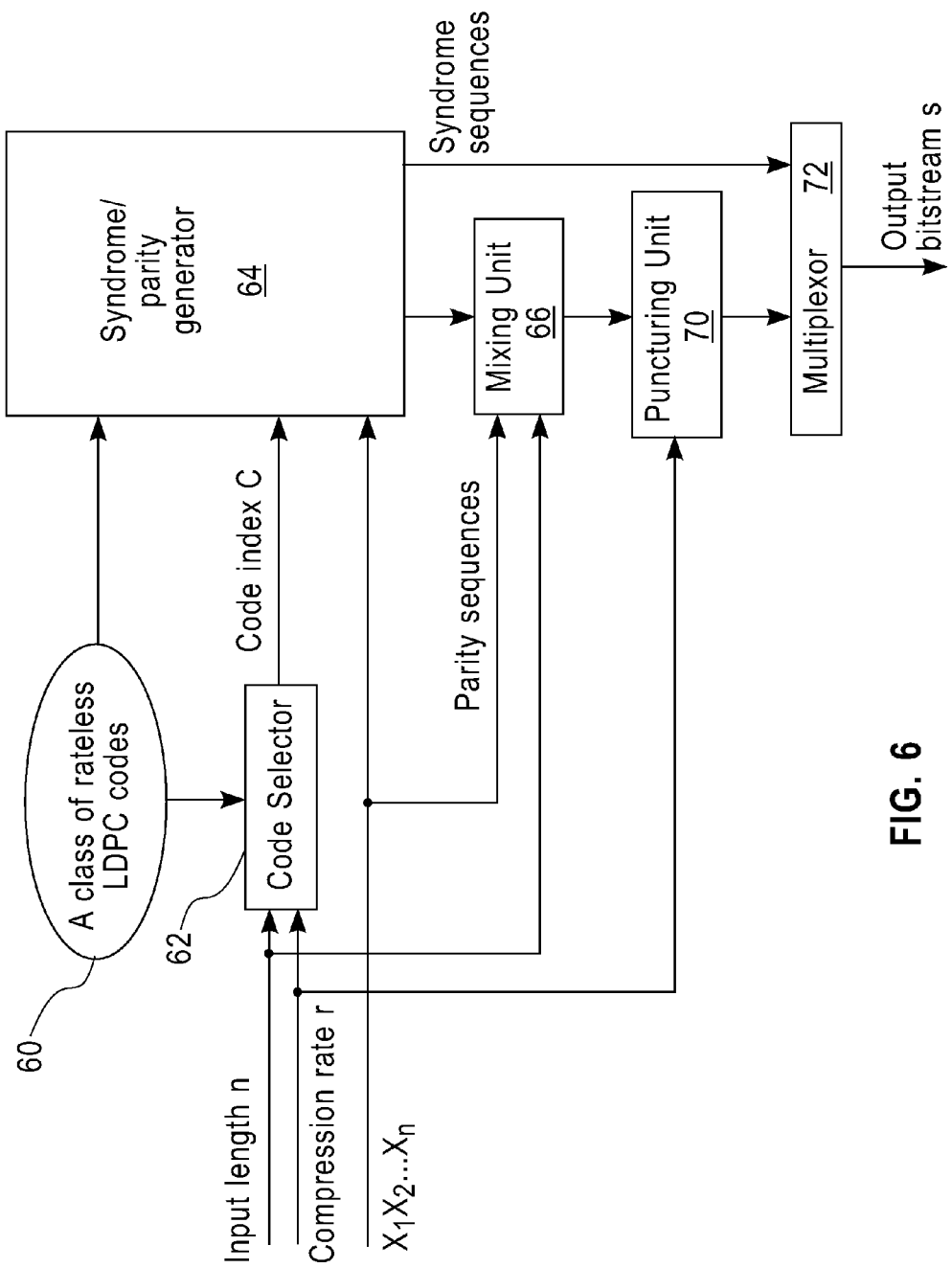
FIG. 6 shows a system for rateless source encoding according to a preferred embodiment of this invention.

FIG. 6 is a diagram illustrating the encoding process in rateless source coding. FIG. 6 shows a small set of LDPC codes 60, a code selector 62, a syndrome/parity generator 64, and a mixing unit 66. Each of the LDPC codes accepts a range of data input lengths and a range of target compression rates, and the code selector 62 selects one of said LDPC codes according to the data input length and the desired compression rate. The syndrome/parity generator 64 generates a syndrome sequence and a parity sequence by using an LDPC code in response to the data input.

The mixing unit 66 mixes the remaining portion of the data sequence, if any, with the generated parity sequence according to a predefined arithmetic operation. A puncturing unit 70 is provided to puncture the parity bits according to the desired compression rates, and a multiplexor 72 is provided to form an output bitstream from the generated syndrome sequence and the punctured parity bit sequence conforming to a predefined syntax.

Figure 7:
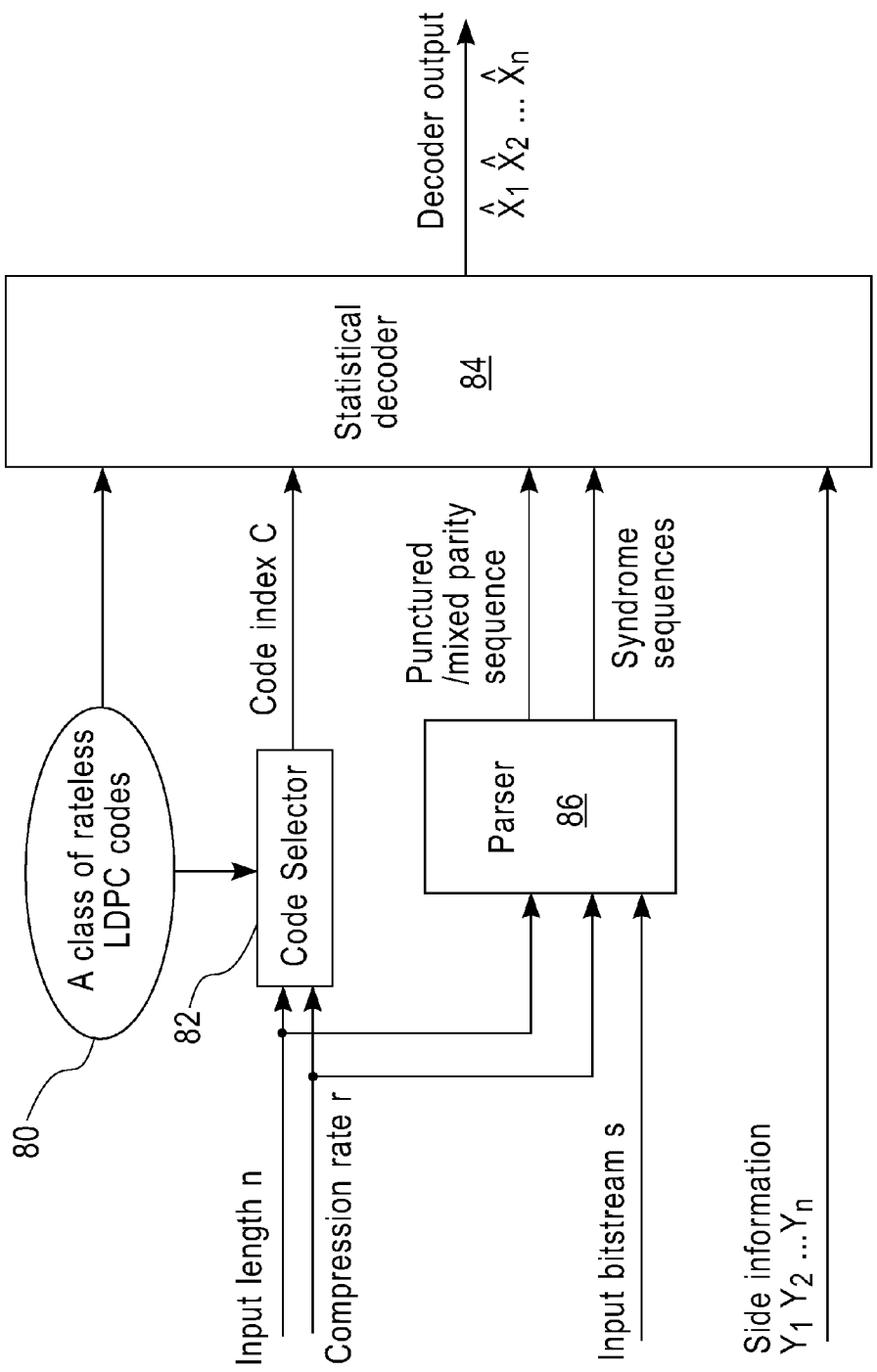
FIG. 7 depicts a system for rateless source decoding according to a preferred embodiment of the present invention.

FIG. 7 is a diagram illustrating the decoding process in rateless source coding. FIG. 7 shows a set of LDPC codes 80, a code selector 82, a decoder 84 and a parser 86. Each of the LDPC codes accepts a range of data input lengths and a range of target compression rates, and the code selector 82 selects one of said LDPC codes according to the data input length and the given compression rate. The data input length, the compression rate and the input bitstream are applied to parser 86, which, in turn, inputs the punctured/mixed parity sequence and the syndrome sequence to decoder 84. Side information $Y_1Y_2 \ldots Y_N$ is also input to the decoder, and the decoder outputs the decoded sequence $\hat{X}_1\hat{X}_2 \ldots \hat{X}_N$.

The method of the present invention will be generally implemented by a computer executing a sequence of program instructions for carrying out the steps of the method and may be embodied in a computer program product comprising media storing the program instructions. For example, FIG. 8 and the following discussion provide a brief general description of a suitable computing environment in which the invention may be implemented. It should be understood, however, that handheld, portable, and other computing devices of all kinds are contemplated for use in connection with the present invention. While a general-purpose computer is described below, this is but one example, the present invention may be implemented in an environment of networked hosted services in which very little or minimal client resources are implicated, e.g., a networked environment in which the client device serves merely as a browser or interface to the World Wide Web.

Although not required, the invention can be implemented via an application-programming interface (API), for use by a developer, and/or included within the network browsing software, which will be described in the general context of computer-executable instructions, such as program modules, being executed by one or more computers, such as client workstations, servers, or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations.

Other well known computing systems, environments, and/or configurations that may be suitable for use with the invention include, but are not limited to, personal computers (PCs), server computers, hand-held or laptop devices, multi-processor systems, microprocessor-based systems, programmable consumer electronics, network PCs, minicomputers, mainframe computers, and the like. The invention may also be practiced in distributed computing environments where tasks are performed by remote processing devices that are linked through a communications network or other data transmission medium. In a distributed computing environment, program modules may be located in both local and remote computer storage media including memory storage devices.

Figure 8:
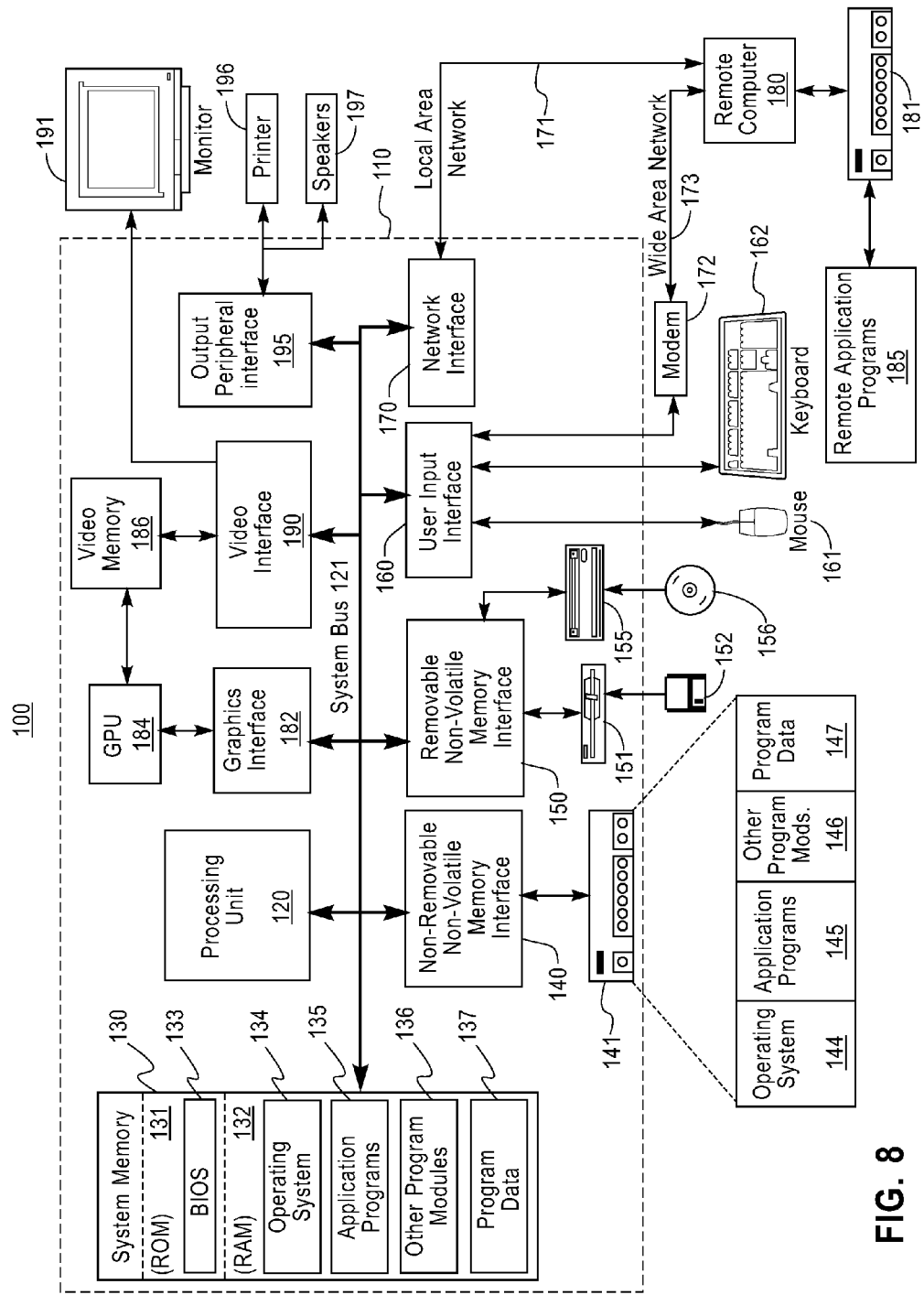
FIG. 8 illustrates a computer system that may be used to implement the present invention.

FIG. 8, thus, illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 600.

With reference to FIG. 8, an exemplary system for implementing the invention includes a general purpose-computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 110.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 8 illustrate operating system 134, application programs 135, other program modules 136, and program data 137.

The computer 110 may also include other removable/non-removable, volatile/nonvolatile computer storage media. By way of example only, FIG. 8 illustrate a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 8 provide storage of computer readable instructions, data structures, program modules and other data for the computer 110. In FIG. 8, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies.

A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB).

A monitor 191 or other type of display device is also connected to the system bus 121 via an interface, such as a video interface 190. A graphics interface 182, such as Northbridge, may also be connected to the system bus 121. Northbridge is a chipset that communicates with the CPU, or host-processing unit 120, and assumes responsibility for accelerated graphics port (AGP) communications. One or more graphics processing units (GPUs) 184 may communicate with graphics interface 182. In this regard, GPUs 184 generally include on-chip memory storage, such as register storage and GPUs 184 communicate with a video memory 186. GPUs 184, however, are but one example of a coprocessor and thus a variety of co-processing devices may be included in computer 110. A monitor 191 or other type of display device is also connected to the system bus 121 via an interface, such as a video interface 190, which may in turn communicate with video memory 186. In addition to monitor 191, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 8. The logical connections depicted in FIG. 8 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 8 illustrates remote application programs 185 as residing on memory device 181. It will be appreciated that the network connections shown are exemplary and other means of establishing a communications link between the computers may be used.

One of ordinary skill in the art can appreciate that a computer 110 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and execution capabilities.

As will be readily apparent to those skilled in the art, aspects of the present invention can be realized in hardware, software, or a combination of hardware and software. Any kind of computer/server system(s)—or other apparatus adapted for carrying out methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of rateless source coding, comprising the steps of:
    providing a set of low-density parity check (LDPC) codes, each of said codes accepting a range of data input lengths and a range of target compression rates;
    identifying a data input having a data input length, and identifying a desired compression rate;
    selecting one of said LDPC codes based on said data input length and desired compression rate;
    encoding the data input, using the selected LDPC code, to generate an encoded sequence of data values; and
    puncturing some of said data values to maintain the compression efficiency of the selected LDPC code.

2. A method according to claim 1, wherein the encoding step includes the step of generating a syndrome sequence and a parity sequence from the data input.

3. A method according to claim 2, wherein the encoding step includes the further step of mixing a remaining portion of the data input with the generated parity sequence according to a predefined arithmetic operation.

4. A method according to claim 2, wherein the parity sequence includes a multitude of parity bits, and the puncturing step includes the step of puncturing the parity bits according to the desired compression rate.

5. A method according to claim 4, comprising the further step of forming an output bit stream from the generated syndrome sequence and the punctured parity bit sequence conforming to a predefined syntax.

6. A method according to claim 5, comprising the further steps of:
    applying said output bit stream to a decoder; and
    decoding said output bit stream using said decoder.

7. A method according to claim 6, comprising the further steps of:
    modeling the parity bits that are punctured as erasures;
    and using said erasure model to decode said output bit stream.

8. A method according to claim 6, wherein the decoding step includes the steps of:
    providing the decoder with side information; and
    using said side information to decode said output bit stream.

9. A method according to claim 6, wherein the decoding step includes the step of decoding said output bit stream without providing the decoder with side information.

10. A method according to claim 6, wherein the decoding step includes the steps of:
    providing the decoder with said selected one of the LDPC codes; and
    decoding said output stream using said selected one of said LDPC codes.

11. A method according to claim 10, wherein the step of providing the decoder with said selected one of the LDPC codes includes the step of providing the decoder with said set of LDPC codes.

12. A system for rateless source coding comprising:
    a set of low-density parity check (LDPC) codes, each of said codes accepting a range of data input lengths and a range of target compression rates;
    a code selector for receiving a first value identifying a data input length and a second value identifying a desired compression rate, and for selecting one of said LDPC codes based on said first and second values;
    a generator for receiving an input data sequence and the selected LDPC code, and for encoding the data sequence using said selected LDPC code by generating a syndrome sequence and a parity sequence from said data sequence; and
    a puncturing unit for puncturing the parity sequence to maintain a target compression rate.

13. A system according to claim 12, further comprising a mixing unit for mixing the parity sequence with a portion of the input data by using a predefined arithmetic operation.

14. A system according to claim 13, further comprising a multiplexor for forming an output bit steam from the generated syndrome sequence and the punctured parity bit sequence conforming to a predefined syntax.

15. A system according to claim 14, further comprising:
    a decoder for decoding said output bit stream;
    a selector for providing the decoder with the selected LDPC code; and
    wherein the decoder decodes said output bit stream using said selected LDPC code.

16. A system according to claim 15, wherein the decoder decodes said output bit stream with/without decoder side information.

17. A program storage device readable by machine, tangibly embodying a program of instructions executable by the machine to perform method steps for rateless source coding, said method steps comprising:
    providing a set of low-density parity check (LDPC) codes, each of said codes accepting a range of data input lengths and a range of target compression rates;
    identifying a data input having a data input length, and identifying a desired compression rate;
    selecting one of said LDPC codes based on said data input length and desired compression rate;

encoding the data input, using the selected LDPC code, to generate an encoded sequence of data values; and puncturing some of said data values to maintain the compression efficiency of the selected LDPC code.

18. A program storage device according to claim 17, wherein the encoding step includes the steps of:

generating a syndrome sequence and a parity sequence from the data input; and mixing a remaining portion of the data input with the generated parity sequence according to a predefined arithmetic operation.

19. A program storage device according to claim 18, wherein the parity sequence includes a multitude of parity bits, and the puncturing step includes the step of puncturing the parity bits according to the desired compression rate.

20. A program storage device according to claim 19, comprising the further step of forming an output bit stream from the generated syndrome sequence and the punctured parity bit sequence conforming to a predefined syntax.

* * * * *